United States Patent
Lu et al.

(10) Patent No.: US 10,884,303 B2
(45) Date of Patent: Jan. 5, 2021

(54) TRANSIENT OVERVOLTAGE PROTECTION CIRCUIT, ARRAY SUBSTRATE COMPRISING THE SAME, AND DISPLAY APPARATUS

(71) Applicants: BOE Technology Group Co., Ltd., Beijing (CN); Hefei Xinsheng Optoelectronics Technology Co., Ltd., Hefei (CN)

(72) Inventors: Wenwu Lu, Beijing (CN); Bingbing Yan, Beijing (CN); Yuanyuan Liu, Beijing (CN); Xueqin Wei, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei (CN)

(*) Notice: Subject to any disclaimer, the term of this patent is extended or adjusted under 35 U.S.C. 154(b) by 591 days.

(21) Appl. No.: 15/567,852

(22) PCT Filed: Mar. 10, 2017

(86) PCT No.: PCT/CN2017/076248
§ 371 (c)(1),
(2) Date: Oct. 19, 2017

(87) PCT Pub. No.: WO2018/028194
PCT Pub. Date: Feb. 15, 2018

(65) Prior Publication Data
US 2018/0292720 A1  Oct. 11, 2018

(30) Foreign Application Priority Data
Aug. 12, 2016  (CN) .......................... 2016 1 0662469

(51) Int. Cl.
*G02F 1/1362* (2006.01)
*H01L 27/02* (2006.01)
(Continued)

(52) U.S. Cl.
CPC .... *G02F 1/136204* (2013.01); *H01L 27/0255* (2013.01); *H01L 27/0288* (2013.01);
(Continued)

(58) Field of Classification Search
CPC ... G02F 1/136204; G06F 3/045; H01L 27/02; H01L 27/0251; H01L 27/0255;
(Continued)

(56) References Cited

U.S. PATENT DOCUMENTS 5,357,393 A * 10/1994 Mojaradi ............ H01L 27/0251
361/118
2007/0171688 A1* 7/2007 Bao ................... H02M 3/33523
363/56.09
2012/0068299 A1  3/2012 Lin et al.

FOREIGN PATENT DOCUMENTS

CN      101162840 A    4/2008
CN      101969194 A    2/2011
(Continued)

OTHER PUBLICATIONS (ON Semiconductor [online] onsemi,com [retrieved on May 12, 2016]. Retrieved from the Internet: https://www.onsemi.com/pub/Collateral/AND8230-D.PDF) (Year: 2016).*
(Continued)

*Primary Examiner* — Jared Fureman
*Assistant Examiner* — Nicolas Bellido
(74) *Attorney, Agent, or Firm* — Westman, Champlin & Koehler, P.A.

(57) ABSTRACT

The present disclosure discloses a transient overvoltage protection circuit, an array substrate, and a display appara-
(Continued)

tus, wherein the transient overvoltage protection circuit comprises a transient suppression circuit configured to discharge a transient high voltage in a signal to be processed to obtain a first processed signal; and an isolation circuit having an input terminal electrically coupled to the transient suppression circuit, the isolation circuit being configured to isolate a residual voltage in the first processed signal to obtain a second processed signal.

6 Claims, 5 Drawing Sheets

(51) Int. Cl.
  *H01L 27/12* (2006.01)
  *H01L 31/167* (2006.01)
  *H02H 9/04* (2006.01)
  *H02H 3/20* (2006.01)
(52) U.S. Cl.
  CPC ........ *H01L 27/1244* (2013.01); *H01L 31/167* (2013.01); *H02H 3/202* (2013.01); *H02H 9/041* (2013.01)
(58) Field of Classification Search
  CPC ............. H01L 27/0288; H01L 27/1244; H01L 31/167; H02H 3/20; H02H 3/202; H02H 9/00; H02H 9/04; H02H 9/041; H02H 9/045; H03K 17/78
  See application file for complete search history.

(56) References Cited

FOREIGN PATENT DOCUMENTS

| CN | 102082428 | A | | 6/2011 |
| CN | 202076785 | U | | 12/2011 |
| CN | 202424153 | U | | 9/2012 |
| CN | 202549831 | U | | 11/2012 |
| CN | 103078663 | A | | 5/2013 |
| CN | 105071367 | A | | 11/2015 |
| CN | 105204706 | A | | 12/2015 |
| CN | 105322936 | A | * | 2/2016 |
| CN | 105322936 | A | | 2/2016 |
| CN | 106099892 | A | | 11/2016 |

OTHER PUBLICATIONS

Hui, Xu et al., Research on Interference Suppression of Embedded Measurement and Control System, Dec. 2011, (IEEE [ online] ieeexplore.ieee.org [retrieved on Dec. 10, 2011]. Retrieved from the Internet: https://ieeexplore.ieee.org/stamp/stamp.jsp?tp=&arnumber=6182099) (Year: 2011).*
First Office Action, including Search Report, for Chinese Patent Application No. 201610662469.0, dated Jan. 25, 2018, 12 pages.
International Search Report and Written Opinion from International Application No. PCT/CN2017/076248, dated Jun. 14, 2017, 13 pages.

* cited by examiner

TRANSIENT OVERVOLTAGE PROTECTION CIRCUIT, ARRAY SUBSTRATE COMPRISING THE SAME, AND DISPLAY APPARATUS

CROSS-REFERENCE TO RELATED APPLICATION(S)

The present application is a Section 371 National Stage Application of International Application No. PCT/CN2017/076248, filed Mar. 10, 2017, which has not yet published, and claims priority to the Chinese Patent Application No. 201610662469.0, filed on Aug. 12, 2016, entitled "TRANSIENT OVERVOLTAGE PROTECTION CIRCUIT, ARRAY SUBSTRATE COMPRISING THE SAME, AND DISPLAY APPARATUS," which is are incorporated herein by reference in its their entirety.

TECHNICAL FIELD

The present disclosure relates to the field of circuit protection, and more particularly, to a transient overvoltage protection circuit, an array substrate comprising the same, and a display apparatus.

BACKGROUND

A circuit solution for a large-size television (TV) product typically comprises a build-up Printed Circuit Board Assembly (PCBA) and a film loop PCBA, which transmit signals therebetween through connectors and a Flexible Flat Cable (FFC) connection. In a process of design and production, Electro-Static Discharge (ESD) easily enters from a connector of an S-PCBA into a Propel Link Gate (PLG) trace on glass, which causes the PLG trace to be burn out, thereby resulting in poor displaying by a liquid crystal display.

SUMMARY

In order to at least partially address or mitigate the above problems, some embodiments of the present disclosure at least aim to provide a transient overvoltage protection circuit, an array substrate comprising the same, and a display apparatus, to improve an effect of transient overvoltage protection.

According to an aspect of the present disclosure, there is provided a transient overvoltage protection circuit, comprising: a transient suppression circuit configured to discharge a transient high voltage in a signal to be processed to obtain a first processed signal; and an isolation circuit having an input terminal electrically coupled to the transient suppression circuit, the isolation circuit being configured to isolate a residual voltage in the first processed signal to obtain a second processed signal.

In some embodiments, the isolation circuit comprises: a switching circuit having an input terminal to input the first processed signal, the switching circuit being configured to isolate the residual voltage in the first processed signal to obtain the second processed signal to be output from an output terminal of the switching circuit.

In some embodiments, the switching circuit comprises: a thin film transistor having a control terminal serving as the input terminal of the switching circuit, an output terminal serving as the output terminal of the switching circuit and coupled to the ground through a first resistor, and an input terminal coupled to a power supply voltage.

In some embodiments, the thin film transistor is an n-Channel Metal Oxide Semiconductor (NMOS) transistor.

In some embodiments, the NMOS transistor has a gate serving as the control terminal, one of a drain and a source serving as the input terminal, and the other of the drain and the source serving as the output terminal.

In some embodiments, the thin film transistor has a turn-on voltage higher than the residual voltage.

In some embodiments, the isolation circuit comprises: a level conversion circuit having an input terminal to input the first processed signal, wherein the input terminal and an output terminal of the level conversion circuit adopt independent power supplies and the input terminal has impedance, to isolate the residual voltage in the first processed signal, so as to obtain the second processed signal to be output from the output terminal of the level conversion circuit.

In some embodiments, the input terminal and the output terminal of the level conversion circuit have a same power supply voltage.

In some embodiments, the isolation circuit comprises a photoelectric coupler having an input terminal to input the first processed signal, the photoelectric coupler being configured to isolate the residual voltage in the first processed signal in a photoelectric coupling manner, to obtain the second processed signal to be output from an output terminal of the photoelectric coupler.

In some embodiments, the photoelectric coupler comprises: a light emitting source having an input terminal serving as the input terminal of the photoelectric coupler, the light emitting source being configured to convert the input first processed signal into an optical signal; and a light receiving device disposed on an opposite side of the light emitting source and configured to receive the optical signal emitted from the light emitting source and to convert the optical signal into a second processed signal, wherein an output terminal of the light receiving device serves as the output terminal of the photoelectric coupler.

In some embodiments, the light emitting source comprises: a light emitting diode having an anode coupled to the input terminal of the photoelectric coupler through a current limiting resistor, and a cathode coupled to the ground.

In some embodiments, the light receiving device comprises a photosensitive diode, a photosensitive triode, or a photosensitive resistor.

In some embodiments, the light receiving device comprises a phototransistor having a collector coupled to a power supply voltage, and an emitter coupled to the output terminal of the photoelectric coupler and coupled to the ground through a pull-down resistor.

According to another aspect of the present disclosure, there is provided an array substrate comprising any transient overvoltage protection circuit described above.

In some embodiments, a signal line configured to transmit the second processed signal is a scan line.

According to a further aspect of the present disclosure, there is provided a display apparatus comprising any array substrate described above.

BRIEF DESCRIPTION OF THE DRAWINGS

In order to more completely understand the embodiments of the present disclosure and advantages thereof, reference will now be made to the following description taken in conjunction with the accompanying drawings in which.

DETAILED DESCRIPTION

Figure 1:
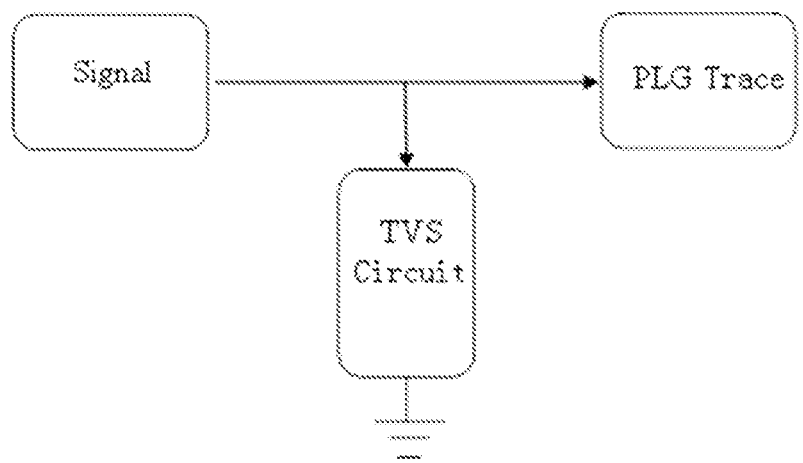
FIG. 1 is a schematic diagram of a transient overvoltage protection circuit in the related art.

In order to make the purposes, technical solutions and advantages of the present disclosure more clear and obvious, the present disclosure will be described in further detail below in conjunction with specific embodiments with reference to the accompanying drawings. The following description of the embodiments of the present disclosure with reference to the accompanying drawings is intended to explain a general concept of the present disclosure, and is not to be construed as limiting the present disclosure. It will therefore be appreciated by those of ordinary skill in the art that various changes and modifications can be made to the embodiments described herein without departing from the scope and spirit of the present disclosure. In addition, the description of known functions and structures is omitted for clarity and conciseness. Further, throughout the accompanying drawings, like reference numerals are used for the same or similar functions and operations.

Hereinafter, a transient overvoltage protection solution according to the embodiments of the present disclosure will be described in detail by taking Electro-Static Discharge (ESD) protection as an example. It should be understood by those skilled in the art, however, that the present disclosure is equally applicable to transient overvoltage protection for a transient overvoltage due to other reasons including, but not limited to, power supply noise, lightning, or other types of surges.

FIG. 1 illustrates a schematic diagram of a transient overvoltage protection circuit in the related art. As shown in FIG. 1, ESD energy may be discharged to the ground through an ESD protection circuit by connecting the ESD protection circuit to a signal line extending to a PLG. In electronic devices such as a liquid crystal display panel etc., a corresponding ESD protection circuit may be designed in order to achieve ESD protection for a signal on a PLG trace. The ESD protection circuit may be implemented by a Transient Voltage Suppressor (TVS) circuit, such as a TVS tube. As shown in FIG. 1, a TVS circuit is coupled to the signal line extending to the PLG, and the other terminal of the TVS circuit is coupled to the ground.

However, it cannot be ensured that various signals on the PLG operate normally in the presence of a high voltage depending solely on the ESD protection measures taken by the TVS circuit, and it is discovered in practice that such circuit cannot pass an ESD test in some cases. For example, the TVS circuit sometimes cannot absorb all the ESD energy. Especially when energy of the ESD increases, the PLG trace of the liquid crystal display may not withstand a residual voltage after the TVS protection, which causes the PLG to be burn out. Therefore, further ESD protection (or more generally, transient overvoltage protection) may be provided by, for example, solutions described in the following embodiments.

Figure 2:
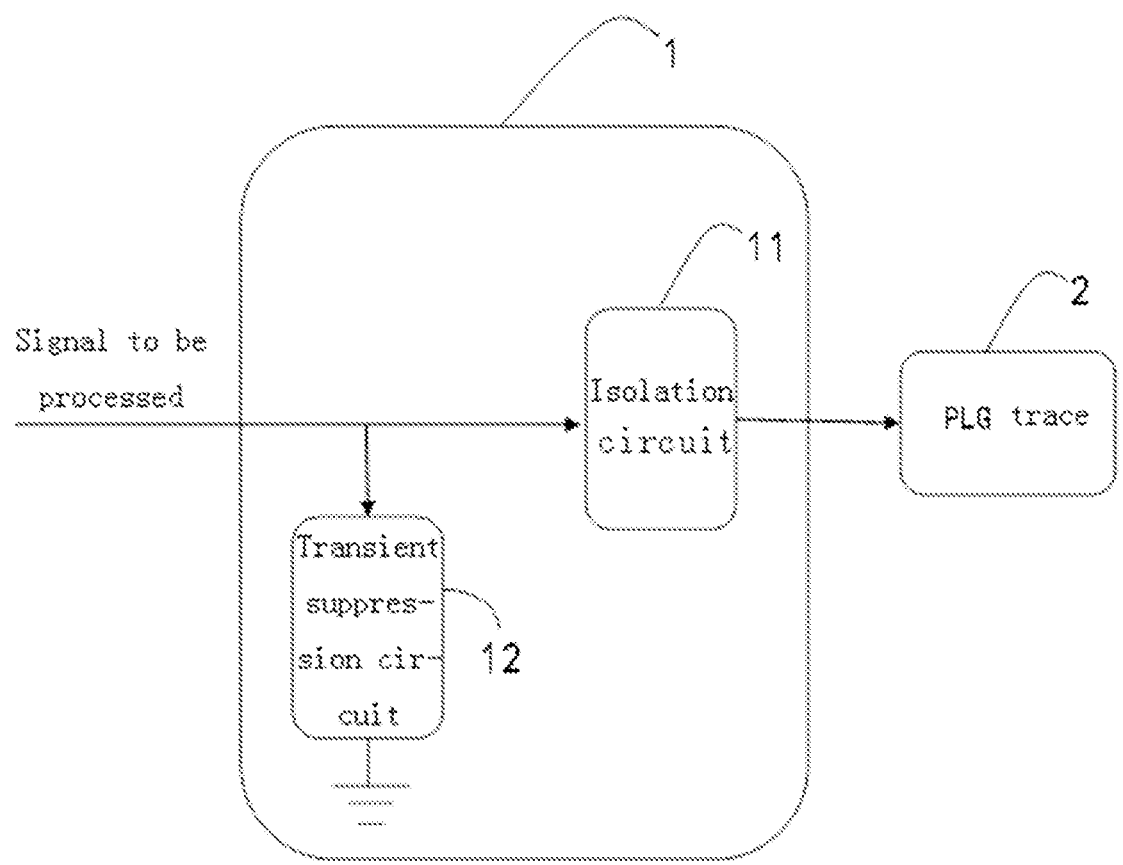
FIG. 2 is an exemplary schematic diagram of an exemplary transient overvoltage protection circuit according to an embodiment of the present disclosure.

FIG. 2 is an exemplary schematic diagram of an exemplary transient overvoltage protection circuit (for example, an ESD protection circuit) according to an embodiment of the present disclosure. As shown in FIG. 2, an ESD protection circuit 1 is provided, which may comprise a transient suppression circuit 12 configured to receive a signal to be processed, and discharge a transient high voltage due to static electricity in the signal to be processed to obtain a first processed signal; and an isolation circuit 11 having an input terminal electrically coupled to the transient suppression circuit 12 and configured to isolate a residual voltage in the first processed signal from which the transient high voltage is discharged to obtain a second processed signal. When there is ESD in the signal to be processed, the transient high voltage caused by static electricity may be discharged through the transient suppression circuit 12, and then the residual voltage may be isolated by the isolation circuit 11, thereby avoiding damages caused by the high voltage due to the static electricity to the PLG circuit and improving the product yield.

In the present embodiment, there may be many manners to implement the circuit of the isolation circuit 11, including, but not limited to, a switching circuit, a level conversion circuit, and/or a photoelectric coupler, which are common in that the corresponding circuit is used to implement isolation of the transient residual voltage. The various exemplary circuit implementations of the isolation circuit 11 will be described below in conjunction with FIGS. 3-6 respectively.

Figure 3:
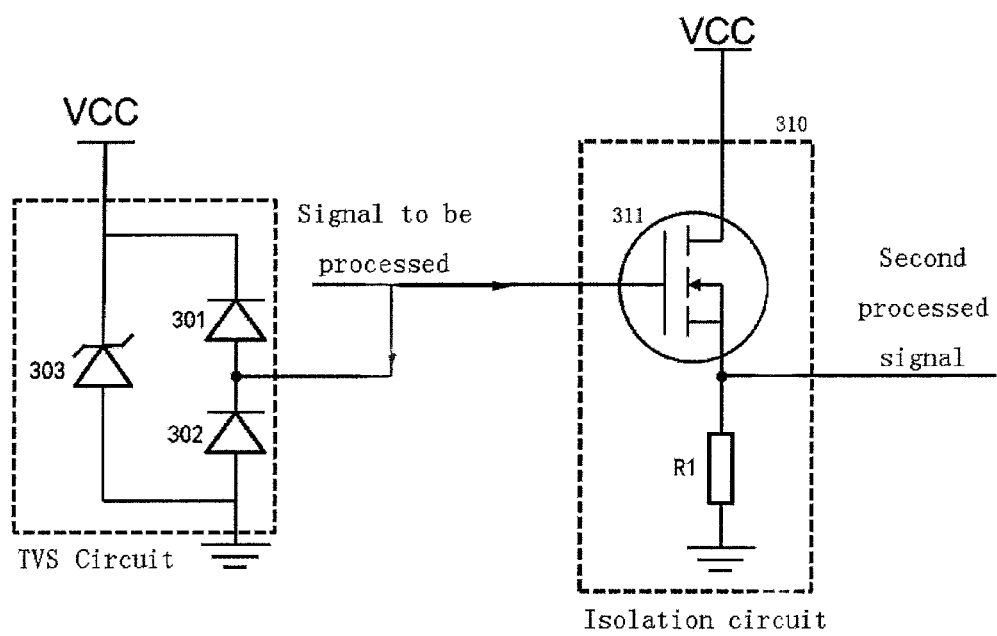
FIG. 3 is an exemplary implementation of an isolation circuit according to an embodiment of the present disclosure.

FIG. 3 is an exemplary implementation of an isolation circuit according to an embodiment of the present disclosure. In this implementation, the isolation circuit may comprise a switching circuit 310 having an input terminal for inputting for example the first processed signal and configured to isolate a residual voltage in the first processed signal from which a transient high voltage is discharged using the switch principle (in which the switching circuit 310 can be turned on only when a voltage applied to the input terminal of the switching circuit 310 exceeds a certain voltage threshold) to obtain a second processed signal and output the second processed signal from an output terminal.

A transient suppression circuit in FIG. 3 may be a TVS circuit, and a signal line of the TVS circuit for inputting the signal to be processed may be divided into two branches which are coupled to an anode of a first diode 301 and a cathode of a second diode 302 of the TVS circuit respectively, wherein an anode of the second diode 302 is coupled to the ground, a cathode of the first diode 301 is coupled to a power supply voltage (VCC) level and a cathode of a voltage regulator diode 303 respectively, and an anode of the voltage regulator diode 303 is coupled to the ground. However, it should be noted that the TVS circuit is only one of transient suppression circuits, and in practice, a variety of transient suppression circuits which are known or developed in the future may be applied. For the circuit design, when ESD of the transient suppression circuit does not occur (transient suppression), it may be ignored, and various electrical parameters of the transient suppression circuit such as breakdown voltage, leakage current and capacitance etc. have no effect on the normal circuit; and when ESD occurs (transient overvoltage), a voltage peak is immediately clamped by a TVS diode to a safe level, so that most of the current is removed from the protected circuit.

As there is certain input impedance in the switching circuit 310, when a residual voltage in the ESD enters the switching circuit 310, the residual voltage cannot reach the output terminal of the switching circuit 310 through the switching circuit 310, and the corresponding residual voltage is also isolated by the switching circuit 310.

In some embodiments, the switching circuit 310 may comprise a thin film transistor 311 having a control terminal serving as the input terminal of the switching circuit 310, an output terminal serving as the output terminal of the switching circuit 310 and coupled to the ground through a first resistor R1 and an input terminal coupled to the power supply voltage. For example, due to a turn-on voltage VGS of the Metal Oxide Semiconductor (MOS) transistor 311, when a high level signal (having a signal voltage higher than the turn-on voltage) is applied to the control terminal (a gate of the MOS transistor 311), the MOS transistor 311 is in a turn-on state and the output terminal is equivalent to being coupled to the power supply to output a high level.

A specific connection manner of the switching circuit 310 is that a signal line configured to transmit the signal to be processed is divided into two branches, one of two branches is coupled to the ground through the TVS circuit, wherein when ESD occurs, most of the electrostatic voltage passes through the transient suppression circuit, and the other of two branches is coupled to the switching circuit 310 and then outputs the processed signal. In the other branch, the switching circuit 310 is configured to isolate a portion of the electrostatic residual voltage which does not pass through the transient suppression circuit for ESD processing and protection.

It should be emphasized that the switching circuit 310 comprises, but is not limited to, a switching circuit 310 composed of p-Channel Metal Oxide Semiconductor (PMOS) transistor and/or an n-Channel Metal Oxide Semiconductor (NMOS) transistor.

A switching circuit 310 including an NMOS transistor 311 is taken as an example for specific description. In FIG. 3, an NMOS-enhanced field effect transistor 311 may be used as an isolation circuit, and has a gate (i.e., a control terminal) which may be used as the input terminal of the switching circuit 310 for inputting the first processed signal, one of a drain or a source (i.e., an input terminal) which may be pulled up to the power supply voltage (VCC) level, and the other of the source or the drain (i.e., an output terminal) which may be pulled down to the ground through a resistor and is coupled to a trace of a PLG circuit serving as the output terminal of the switching circuit 310 (or isolation circuit).

In a normal state, when the input terminal of the isolation circuit is at a high level, the NMOS field effect transistor 311 is turned on and the output terminal is also at a high level, and when the input terminal of the isolation circuit is at a low level, the field effect transistor 311 is turned off and the output terminal is coupled to the ground through a pull-down resistor and is at a low level.

When ESD occurs, a discharge terminal (i.e., the input terminal of the switching circuit 310) firstly discharges a voltage through the TVS circuit, and an input (for example, the first processed signal) after the discharge of the TVS circuit enters the isolation circuit including the switching circuit 310. There is input impedance in the isolation circuit, the residual voltage is insufficient to turn on the NMOS transistor 311 (for example, the residual voltage is lower than the turn-on voltage of the NMOS transistor 311), and therefore the output terminal does not output a corresponding voltage, i.e., realizing isolation of the residual voltage in the switching circuit 310. That is, when there is ESD in a signal, as there is large input impedance in the field effect transistor 311, the residual voltage after the ESD passes through the TVS cannot be transmitted to the output terminal through the field effect transistor 311, thereby protecting the PLG trace and ensuring the stability of the screen display effect.

In some embodiments, the turn-on voltage VGS of the MOS transistor 311 in the present implementation may be between a high level signal and the residual voltage, i.e., being lower than or equal to the high level signal voltage and higher than a value of the residual voltage. In this way, it is possible to not only operate normally without ESD, but also at least partially isolate the residual voltage which is not eliminated by the TVS circuit at the front end when ESD occurs.

In a practical process of ESD protection, there are many lines (for example, data lines) which are required to be protected, and an ESD protection circuit including the transient suppression circuit and the switching circuit 310 may be arranged in each line to ensure that ESD which occurs in each line can be suppressed and the signal of the PLG trace is stable. In this implementation, the ESD protection effect is significantly effective, the impact resistance is good, the failure rate is low, and the high-standard ESD test can be smoothly passed.

Figure 4:
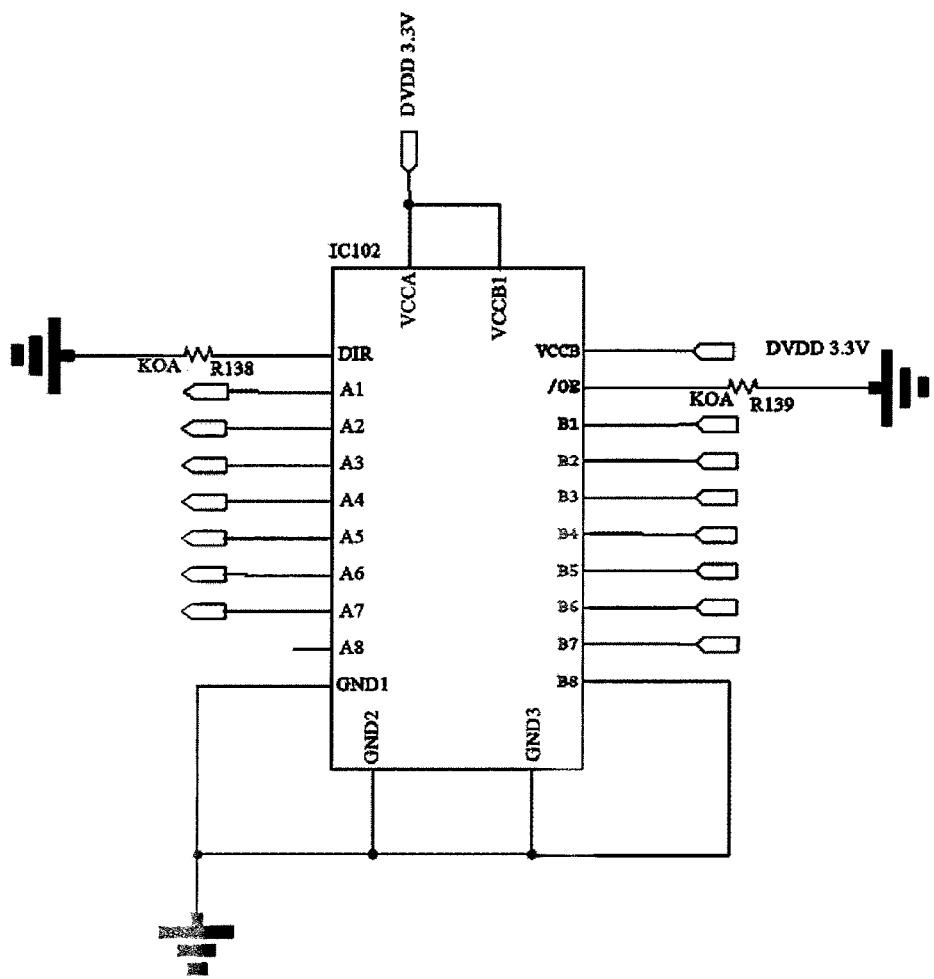
FIG. 4 is another exemplary implementation of an isolation circuit according to an embodiment of the present disclosure.

FIG. 4 is another exemplary implementation of an isolation circuit according to an embodiment of the present disclosure. In this implementation, the isolation circuit may comprise a level conversion circuit having an input terminal for inputting a first processed signal, wherein the input terminal and an output terminal of the level conversion circuit adopt independent power supplies to isolate a residual voltage in the first processed signal from which a transient high voltage is discharged, so as to obtain a second processed signal and output the second processed signal from the output terminal.

In the level conversion circuit, the input terminal is powered by one power supply, and the output terminal is powered by another power supply. Due to the use of two independent power supplies, when there is an ESD residual voltage at the input terminal, it will not be transmitted to the output terminal, and instead, the ESD residual voltage is isolated to remain at the input terminal.

The level conversion circuit may be implemented using a dedicated level conversion chip. For example, FIG. 4 illustrates a level conversion chip IC102 with a specific model of SN74LVC8T245 serving as the isolation circuit. Of course, those skilled in the art can select other types of level conversion chips to be applied in the level conversion circuit according to the present disclosure, as long as they have an input terminal and an output terminal which are powered by different power supplies, including, but not limited to, models of SN74LVC1T45, SN74AVC1T45 and SN74AVCH8T245. The level conversion chip IC102 may be designed to achieve a communication manner of isolating the power supplies between two signal buses.

In the level conversion chip of FIG. 4, VCCA and VCCB1 ports are interconnected and are coupled together to a 3.3V digital power supply voltage DVDD, VCCA is a voltage source for A1-A8, and an output direction pin (DIR) is coupled to the ground through a resistor R138. In this solution, the A1-A8 ports are used as output terminals, which are equivalent to the output terminal of the isolation circuit according to the present disclosure. In this implementation, the A8 port is coupled to the air, the VCCB port is also coupled to a 3.3V digital power supply voltage, an output enablement pin $\overline{OE}$ is coupled to the ground through another resistor R139, B1-B8 ports are coupled to back ends of various transient suppression circuits as input terminals, and the B8 port is coupled to the ground in this implementation. In this implementation, there may also be three ground ports GND1, GND2 and GND3 in the IC102 chip.

Figure 5:
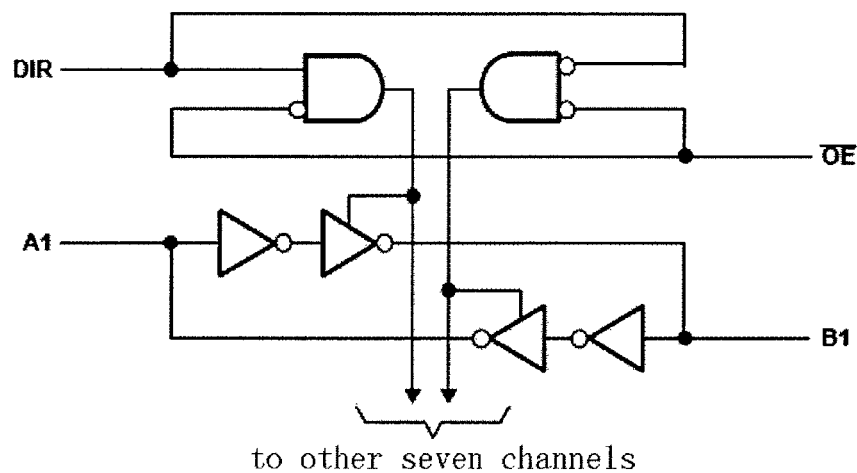
FIG. 5 is an exemplary logic circuit diagram of one of channels according to the exemplary implementation shown in FIG. 4.

FIG. 5 is an exemplary logic circuit diagram of one of channels of the IC102 chip shown in FIG. 4. A logic level of the output direction pin DIR and the output enablement pin $\overline{OE}$ may control an output direction of the B1 terminal and the A1 terminal (or other input terminals B2-B8 and output terminals A2-A8) and whether or not a signal is output respectively. In the embodiment shown in FIG. 5, the output direction is set to be from the B1 port to the A1 port (as illustrated by the DIR being coupled to the ground in FIG. 4), and a signal may be output when $\overline{OE}$ is at a low level (as illustrated by $\overline{OE}$ being coupled to the ground in FIG. 4), and a signal cannot be output when DE is at a high level. However, the present disclosure is not limited thereto, and in practice, different configurations may be adopted according to Table 1 below.

In the embodiments shown in FIGS. 4 and 5, when the B1 port inputs a high level, the A1 port is also at a high level, when the B1 port is at a low level, the output enablement terminal DE is coupled to the ground through a resistor (as shown in FIG. 4), and the A1 port also outputs a low level. The signal channel is a channel on the chip. Other channels are arranged in the same way as the channel (that is, A2-A8 are arranged in the same way as A1 and B2-B8 are arranged in the same way as B1). Therefore, the IC102 chip may be coupled to multiple signal lines to isolate the electrostatic residual voltages at the same time.

Table 1 is a correspondence between a relative relationship between the control signals $\overline{OE}$ and DIR in FIG. 5 and an implementation function. In the present implementation, when, for example, the residual voltage in the first processed signal is insufficient to cause $\overline{OE}$ to be at a low level (for example, through a logic "NOT" gate, i.e., a value of the residual voltage is less than the high level control signal), the B port is in a high impedance state, which therefore can isolate the residual voltage input at the B port.

TABLE 1

| Control signals | | Ports | | |
| --- | --- | --- | --- | --- |
| $\overline{OE}$ | DIR | A port | B port | Implemented function |
| Low | Low | Turn-on | High resistance | Data transmission from the B port to the A port |
| Low | High | High resistance | Turn-on | Data transmission from the A port to the B port |
| High | High/Low | High resistance | High resistance | Isolation |

For example, in the embodiments shown in FIGS. 4 and 5, in a normal state, the signal to be processed is at a high level, and the first processed signal may be input at the B1 terminal. It can be known from the logic circuit in FIG. 5 that as the B1 port is triggered, the corresponding output port A1 also starts to output data; as power supply voltages for the B1 input terminal and the A1 output terminal are the same, the output terminal A1 is also at a high level; when the input terminal B1 is at a low level, it can be known from the operation of the logic circuit in FIG. 5 and the table 1 that the output terminal A1 is also at a low level; and other branches have the same input and output relationship and principle as those of the B1 and A1 terminals.

When ESD occurs, the signal to be processed firstly discharges a voltage through the TVS circuit, and a residual voltage of the first processed signal processed by the TVS circuit is input to the isolation circuit including the level conversion circuit. As the transmission from the B port to the A port is implemented, as shown in table 1, the A1 port and the B1 port are firstly isolated as described above, and the B1 input terminal is in a high impedance state. Therefore, the output terminal does not respond to the residual voltage signal, i.e., realizing isolation of the residual voltage in the level conversion circuit. That is, when there is ESD in the signal, the output of the level conversion chip in a high impedance state, a residual voltage after the ESD passes through the TVS cannot be transmitted to the output terminal through the level conversion chip, thereby protecting the PLG trace and ensuring the stability of the screen display effect. Other branches have the same input and output relationship and principle as those of the B1 and A1 terminals.

In some embodiments, according to the characteristics of the level conversion chip of SN74LVC8T245, it is preferable in the chip in the present implementation that the output terminal VCCA and the input terminal VCCB are the same, i.e., both at a voltage of 3.3V, and a corresponding switching turn-on range is from 0.8V to 6.3V.

In a practical process of EDS protection, there are many lines (for example, data lines) which are required to be protected, and the transient suppression circuit may be arranged in each line and then is coupled to the level conversion circuit chip, to ensure that ESD which occurs in each line can be suppressed and the signal of the PLG trace is stable.

According to an experimental test, after adding the isolation circuit including the level conversion circuit into this model, the ESD protection effect is highly effective, the impact resistance is good, the failure rate is low, and the high-standard ESD test can be smoothly passed.

Figure 6:
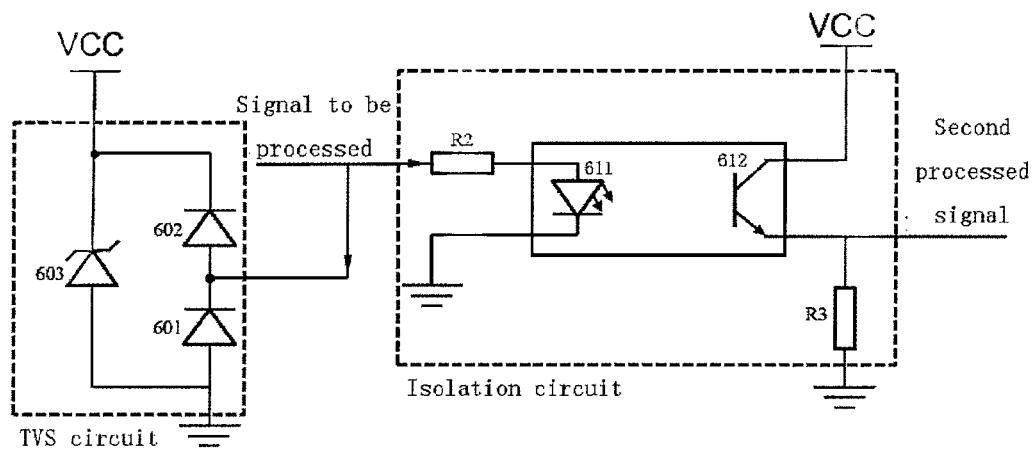
FIG. 6 is a further exemplary implementation of an isolation circuit according to an embodiment of the present disclosure.

FIG. 6 is a further exemplary implementation of an isolation circuit according to an embodiment of the present disclosure. In this implementation, the isolation circuit may comprise a photoelectric coupler, wherein the photoelectric coupler has an input terminal for inputting a first processed signal, and is configured to isolate a residual voltage in the first processed signal from which a transient high voltage is discharged in a photoelectric coupling manner, to obtain a second processed signal and the second processed signal from an output terminal.

The photoelectric coupler (also referred to as a photoelectric isolator, or a optocoupler) packages a light emitting device (i.e., a light emitting source) 611 and a photosensitive device (i.e., a light receiving device) 612 together, so that the light emitting device 611 converts an input electric signal into an optical signal and transfer the optical signal to the photosensitive device 612, and the photosensor 612 converts the optical signal into an electrical signal for output. As there is no direct electrical connection between the light emitting device 611 and the photosensitive device 612, not only the signal is coupled, but also a function of interference isolation is realized.

The photoelectric coupler can effectively suppress spikes such as the residual voltage etc. to improve a signal to noise ratio on the channel mainly for the following several reasons: (1) there is very small input impedance in the photoelectric coupler, and is generally only a few hundred ohms, while there is large impedance in the interference source. When a residual voltage enters, only weak current can be formed on the light emitting device 611, which cannot cause the photosensitive device 612 to generate current due to insufficient energy; (2) there is no electrical connection between an input loop and an output loop of the photoelectric coupler, and there is extremely small distributed capacitance and large insulation resistance therebetween. Therefore, interference due to noises such as the residual voltage etc. of a loop on one side is difficult to be fed into a loop on the other side through the photoelectric coupler, which avoids generation of an interference signal due to common impedance coupling; (3) the photoelectric coupler can play a very good security role, and will not be damaged even if an external input signal is shorted because the input loop and the output loop of the photoelectric coupler can withstand a high voltage of several thousand volts; and (4) a response speed of the photoelectric coupler is fast, for example, a response delay time is only about 10 μs.

A transient suppression circuit in FIG. 6 may be a TVS circuit, and a signal line of the TVS circuit for inputting a signal to be processed may be divided into two branches which are coupled to a cathode of a diode 601 and an anode of a diode 602 of the TVS circuit respectively, wherein an anode of the diode 601 is coupled to the ground, a cathode of the diode 602 is coupled to a VCC level and a cathode of a voltage regulator diode 603 respectively, and an anode of the voltage regulator diode 603 is coupled to the ground. However, it should be noted that the TVS circuit is only one of transient suppression circuits, and in practice, a variety of transient suppression circuits which are known or developed in the future may be applied.

In FIG. 6, the light emitting source 611 has an input terminal serving as the input terminal of the photoelectric coupler and configured to convert the input first processed signal into an optical signal, wherein a signal line configured to transmit the first processed signal may be coupled to the light emitting source 611 through a resistor R2; and the light receiving device 612 is disposed on an opposite side of the light emitting source 611 and is configured to receive an optical signal emitted from the light emitting source 611 and convert the optical signal into a second processed signal, wherein an output terminal of the light receiving device 612 serves as an output terminal of the photoelectric coupler.

A variety of light emitting devices which are known or developed in the future may be selected as the light emitting source 611. In the present implementation, the light emitting source 611 may comprise a light emitting diode 611 having an anode coupled to the input terminal of the photoelectric coupler through a current limiting resistor, and a cathode coupled to the ground.

The light receiving device 612 may be selected to comprise a photosensitive diode, a photosensitive triode, a photosensitive resistor or a phototransistor. In the present implementation, specifically, a phototransistor 612 may be selected as the light receiving device 612, wherein the phototransistor 612 has a collector coupled to a power supply voltage, and an emitter coupled to the output terminal of the photoelectric coupler and coupled to the ground through a pull-down resistor R3.

In a normal state, when the signal to be processed is at a high level, the first processed signal is transmitted into the light emitting diode 611, the phototransistor 612 receives light and then generates photocurrent, and a connection between the collector and the emitter is turned on. As the output terminal is coupled to the power supply voltage, the emitter outputs a high level; and when the input terminal is at a low level, the emitter of the phototransistor 612 is coupled to the ground through the pull-down resistor, and therefore outputs a low level.

When ESD occurs, the signal to be processed firstly discharges a voltage through the TVS circuit, and a residual voltage is input into the isolation circuit including the photoelectric coupler from the back end of the TVS circuit. When the residual voltage enters, only weak current can be formed on the light emitting device 611. As there is no sufficient energy to cause the photosensitive device 612 to emit light, the output terminal does not output a corresponding voltage, i.e., realizing isolation of the residual voltage in the switching circuit. That is, when there is ESD in the signal, due to the impedance at the input terminal of the photoelectric coupler itself, the formed weak current cannot cause the phototransistor 612 to emit light, and the residual voltage after the ESD passes through the TVS cannot be transmitted to the output terminal through the photoelectric coupler, thereby protecting the PLG trace and ensuring the stability of the screen display effect.

The ESD protection circuit according to the present embodiment comprises but is not limited to a TVS and a piezoresistor, and may also be a variety of ESD protection circuits which are known or developed in the future.

The TVS is a commonly used device which can clamps a voltage or current to a safe level when there is ESD. A maximum clamp voltage VC of the TVS should be less than a maximum voltage which can be withstood by the protection circuit. A circuit connection manner of the TVS is not limited to the connection manner shown in FIG. 3 or FIG. 6, and appropriate modifications can be performed on this basis.

The piezoresistor may be a metal oxide piezoresistor and a multi-layer piezoresistor, which is typically coupled crosses the input terminals of the signal lines to be processed, and are coupled in series with a filter inductor and a fuse to protect the piezoresistor itself.

In addition, in some embodiments, there is also provided an array substrate, which may comprise the transient overvoltage protection circuit as described above. In some embodiments, the array substrate may further comprise a first signal line configured to transmit a signal to be processed and a second signal line configured to transmit a second processed signal.

In some embodiments, the transient overvoltage protection circuit is disposed primarily between a connector of a PCBA and a PLG trace on glass. In some embodiments, the trace (i.e., the second signal line) may be a scan line.

Figure 7:
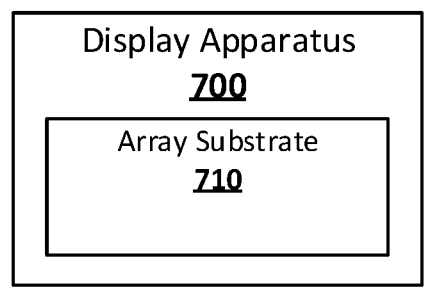
FIG. 7 is an exemplary diagram of a display apparatus comprising an array substrate according to an embodiment of the present disclosure.

In some embodiments, there is also provided a display apparatus 700 shown in FIG. 7 which may comprise an array substrate 710 as described above.

In some embodiments, an arrangement manner may be set to assemble the display apparatus 700 by using the array substrate 710 as one component in an assembly manner which is known or is developed in the future.

In some embodiments, the display apparatus 700 may be, but is not limited to, any product or component having a display function such as a mobile phone, a tablet computer, a television set, a display, a notebook computer, a digital photo frame, a navigator, etc.

It should be noted that, functions described herein as being implemented by only hardware, only software and/or firmware can also be implemented by means of dedicated hardware, a combination of general purpose hardware and software, etc. For example, functions described as being implemented by dedicated hardware (for example, a Field Programmable Gate Array (FPGA), an Application Specific Integrated Circuit (ASIC), etc.) can be implemented by general purpose hardware (for example, a Central Processing Unit (CPU), a Digital Signal Processor (DSP)) in combination with software, and vice versa.

The specific embodiments described above are further detailed description of the purposes, technical solutions and beneficial effects of the present disclosure. It is to be understood that the foregoing description is merely specific embodiments of the present disclosure, and is not intended to be limiting of the present disclosure. Any modifications, equivalent substitutions, improvements etc. which are made within the spirit and principles of the present disclosure are intended to be included within the protection scope of the present disclosure.

We claim:

1. A transient overvoltage protection circuit, comprising:
a transient suppression circuit configured to discharge a transient high voltage in a signal to be processed to obtain a first processed signal; and
an isolation circuit having an input terminal electrically coupled to the transient suppression circuit, the isolation circuit being configured to isolate a residual voltage in the first processed signal to obtain a second processed signal,
wherein the isolation circuit comprises a level conversion circuit having an input terminal to input the first processed signal,
wherein the input terminal and an output terminal of the level conversion circuit adopt independent power supplies and the input terminal has impedance, to isolate the residual voltage in the first processed signal, so as to obtain the second processed signal to be output from the output terminal of the level conversion circuit.

2. The transient overvoltage protection circuit according to claim 1, wherein the transient suppression circuit comprises:
a first diode having an anode coupled to the input terminal of the isolation circuit and a cathode coupled to an input terminal of the transient suppression circuit;
a second diode having an anode coupled to a ground and a cathode coupled to the input terminal of the isolation circuit; and
a third diode having an anode coupled to the ground and a cathode coupled to the input terminal of the transient suppression circuit.

3. The transient overvoltage protection circuit according to claim 1, wherein the input terminal and the output terminal of the level conversion circuit have a same power supply voltage.

4. An array substrate comprising the transient overvoltage protection circuit according to claim 1.

5. The array substrate according to claim 4, wherein a signal line configured to transmit the second processed signal is a scan line.

6. A display apparatus comprising the array substrate according to claim 4.

* * * * *